(12) United States Patent
Noghabaei et al.

(10) Patent No.: US 12,362,594 B2
(45) Date of Patent: Jul. 15, 2025

(54) OPTIMIZATION SYSTEM AND METHOD FOR RADIO FREQUENCY ENERGY HARVESTING

(71) Applicant: POLYVALOR, LIMITED PARTNERSHIP, Québec (CA)

(72) Inventors: Seyed Mohammad Noghabaei, Longueuil (CA); Rafael Radin, Florianopolis-SC (BR); Yvon Savaria, Montréal (CA); Mohamad Sawan, Montréal (CA)

(73) Assignee: POLYVALOR, LIMITED PARTNERSHIP, Quebec (CA)

( * ) Notice: Subject to any disclaimer, the term of this patent is extended or adjusted under 35 U.S.C. 154(b) by 0 days.

(21) Appl. No.: 18/226,464

(22) Filed: Jul. 26, 2023

(65) Prior Publication Data

US 2024/0039327 A1 Feb. 1, 2024

Related U.S. Application Data

(60) Provisional application No. 63/393,078, filed on Jul. 28, 2022.

(51) Int. Cl.
*H02J 50/00* (2016.01)
*H02J 50/20* (2016.01)
(Continued)

(52) U.S. Cl.
CPC ............ *H02J 50/001* (2020.01); *H02J 50/20* (2016.02); *H03H 7/40* (2013.01); *H03F 1/223* (2013.01)

(58) Field of Classification Search
CPC ............... H02J 50/00; H03H 7/40; H03F 1/00
See application file for complete search history.

(56) References Cited

U.S. PATENT DOCUMENTS 7,768,406 B1 * 8/2010 Peach ................. H02J 50/20
340/645
10,978,917 B2 * 4/2021 Freitas .................... H02J 50/40
(Continued)

OTHER PUBLICATIONS

Kim et al., "Ambient RF energy-harvesting technologies for self-sustainable standalone wireless sensor platforms," Proceedings of the IEEE, vol. 102, No. 11, pp. 1649-1666, 2014, https://doi.org/10.1109/JPROC.2014.2357031.
(Continued)

*Primary Examiner* — Rexford N Barnie
*Assistant Examiner* — Joseph N Inge
(74) *Attorney, Agent, or Firm* — NORTON ROSE FULBRIGHT CANADA LLP (57) ABSTRACT

An optimization method comprising: (a) receiving a target value for power received at an antenna, (b) selecting a number of rectifier stages from a first range, and selecting a rectifier transistor drain current from a second range, (c) determining a computed value of the received power, (d) determining an input voltage at which the computed value of the received power matches the target value, (e) determining an output voltage based on the input voltage, the number of stages, and the transistor drain current, (f) when at least one additional value from the first and/or the second range remains to be selected, incrementing the number of stages and/or the transistor drain current, and repeating steps (c) to (e), and (g) when all values from the first and the second range are selected, determining a final number of stages and a final transistor drain current at which the output voltage is highest.

20 Claims, 8 Drawing Sheets

(51) Int. Cl.
H03F 1/22 (2006.01)
H03H 7/40 (2006.01)

(56) References Cited

U.S. PATENT DOCUMENTS

| | | | | |
|---|---|---|---|---|
| 2007/0087719 A1* | 4/2007 | Mandal | ............... | H01Q 1/22 |
| | | | | 455/299 |
| 2014/0111032 A1* | 4/2014 | Shearer | ............... | H04B 1/1607 |
| | | | | 307/149 |
| 2014/0268964 A1* | 9/2014 | Xia | ............... | H02M 7/25 |
| | | | | 363/127 |
| 2014/0327390 A1* | 11/2014 | Park | ............... | H02J 50/12 |
| | | | | 320/108 |
| 2017/0155340 A1* | 6/2017 | Luan | ............... | H02M 1/08 |
| 2018/0069486 A1* | 3/2018 | Ouda | ............... | H02J 50/80 |
| 2019/0288609 A1* | 9/2019 | Tsuru | ............... | H02J 50/20 |
| 2023/0208188 A1* | 6/2023 | Xu | ............... | H02J 50/001 |
| | | | | 307/104 |

OTHER PUBLICATIONS

Paradiso et al., "Energy scavenging for mobile and wireless electronics," Pervasive Comput., vol. 4, No. 1, pp. 18-27, 2005, https://doi.org/10.1109/MPRV.2005.9.

Papotto et al., "A 90-nm CMOS threshold compensated RF energy harvester," IEEE J. Solid-State Circuits, vol. 46, No. 9, pp. 1985-1997, 2011, https://doi.org/10.1109/JSSC.2011.2157010.

Noghabaei et al., "A high-efficiency ultra-low-power CMOS rectifier for RF energy harvesting applications," IEEE International Symposium on Circuits and Systems (ISCAS), pp. 1-4, 2018, https://doi.org/10.1109/ISCAS.2018.8351149.

Stoopman et al., "Co-design of a CMOS rectifier and small loop antenna for highly sensitive RF energy harvesters," IEEE J. Solid-State Circuits, vol. 49, No. 3, pp. 622-634, 2014, https://doi.org/10.1109/JSSC.2014.2302793.

Hameed et al., "A 3.2 V-15 dBm adaptive threshold voltage compensated RF energy harvester in 130 nm CMOS," IEEE Trans. Circuits Syst. I, Reg. Papers, vol. 62, No. 4, pp. 948-956, 2015, https://doi.org/10.1109/TCSI.2015.2413153.

Parks et al., "Sifting through the airwaves: Efficient and scalable multiband RF harvesting," in RFID (IEEE RFIO), 2014 IEEE International Conference on, pp. 74-81, 2014, https://doi.org/10.1109/RFID.2014.6810715.

Kuhn et al., "A multi-band stacked RF energy harvester with RF-to-DC efficiency up to 84%," IEEE Trans. Microw. Theory Techn., vol. 63, No. 5, pp. 1768-1778, 2015, https://doi.org/10.1109/TMTT.2015.2416233.

Li et al., "An antenna co-design dual band RF energy harvester," IEEE Trans. Circuits Syst. I, Reg. Papers, vol. 60, No. 12, pp. 3256-3266, 2013, https://doi.org/10.1109/TCSI.2013.2264712.

Visser et al., "RF energy harvesting and transport for wireless sensor network applications: Principles and requirements," Proceedings of the IEEE, vol. 101, No. 6, pp. 1410-1423, 2013, https://doi.org/10.1109/JPROC.2013.2250891.

Dekimpe et al., "A battery-less BLE smart sensor for room occupancy tracking supplied by 2.45-GHz wireless power transfer," Integration, vol. 67, pp. 8-18, 2019, https://doi.org/10.1016/j.vlsi.2019.03.006.

Mandal et al., "Low-Power CMOS Rectifier Design for RFID Applications," IEEE Transactions on Circuits and Systems I: Regular Papers, vol. 54, No. 6, pp. 1177-1188, 2007, https://doi.org/10.1109/TCSI.2007.895229.

Le et al., "Efficient far-field radio frequency energy harvesting for passively powered sensor networks," IEEE Journal of solid-state circuits, vol. 43, No. 5, pp. 1287-1302, 2008, https://doi.org/10.1109/JSSC.2008.920318.

Hashemi et al., "A high-efficiency low-voltage CMOS rectifier for harvesting energy in implantable devices," IEEE Transactions on Biomedical Circuits and Systems, vol. 6, No. 4, pp. 326-335, 2012, https://doi.org/10.1109/TBCAS.2011.2177267.

Hsieh et al., "An RF Energy Harvester With 44.1% PCE at Input Available Power of—12 dBm," IEEE Transactions on Circuits and Systems I: Regular Papers, vol. 62, No. 6, pp. 1528-1537, 2015, https://doi.org/10.1109/TCSI.2015.2418834.

Lu et al., "A Wide Input Range Dual-Path CMOS Rectifier for RF Energy Harvesting," IEEE Transactions on Circuits and Systems II: Express Briefs, vol. 64, No. 2, pp. 166-170, 2017, https://doi.org/10.1109/TCSII.2016.2554778.

Kotani et al., "High efficiency CMOS rectifier circuit with self-Vth-cancellation and power regulation functions for UHF RFIDs," in Proc. IEEE Asian Solid-State Circuits Conf. (ASSCC), pp. 119-122, 2007, https://doi.org/10.1109/ASSCC.2007.4425746.

Kotani et al., "High-Efficiency Differential-Drive CMOS Rectifier for UHF RFIDs," IEEE Journal of Solid-State Circuits, vol. 44, No. 11, pp. 3011-3018, 2009, https://doi.org/10.1109/JSSC.2009.2028955.

Saffari et al., "An rf-to-dc rectifier with high efficiency over wide input power range for rf energy harvesting applications," IEEE Transactions on Circuits and Systems I: Regular Papers, vol. 66, No. 12, pp. 4862-4875, 2019, https://doi.org/10.1109/TCSI.2019.2931485.

Umeda et al., "A 950-MHz Rectifier Circuit for Sensor Network Tags With 10-m Distance," IEEE Journal of Solid-State Circuits, vol. 41, No. 1, pp. 35-41, 2006, https://doi.org/10.1109/JSSC.2005.858620.

Moghaddam et al., "A 73.9%-Efficiency CMOS Rectifier Using a Lower DC Feeding (LDCF) Self-Body-Biasing Technique for Far-Field RF Energy-Harvesting Systems," IEEE Transactions on Circuits and Systems I: Regular Papers, vol. 64, No. 4, pp. 992-1002, 2017, https://doi.org/10.1109/TCSI.2016.2623821.

Xu et al., "A temperature and process compensated ultralow-voltage rectifier in standard threshold cmos for energy-harvesting applications," IEEE Transactions on Circuits and Systems II: Express Briefs, vol. 58, No. 12, pp. 812-816, 2011, https://doi.org/10.1109/TCSII.2011.2173976.

Shameli et al., "Power harvester design for passive UHF RFID tag using a voltage boosting technique," IEEE Transactions on Microwave Theory and Techniques, vol. 55, No. 6, pp. 1089-1097, 2007, https://doi.org/10.1109/TMTT.2007.896819.

Levacq et al., "Composite ULP diode fabrication, modelling and applications in multi-Vth FD SOI CMOS technology," Solid-State Electronics, vol. 48, No. 6, pp. 1017-1025, 2004, https://doi.org/10.1016/j.sse.2003.12.016.

Haddad et al., "Automated design of a 13.56 MHz 19 μW passive rectifier with 72% efficiency under 10 μA load," IEEE Journal of Solid-State Circuits, vol. 51, No. 5, pp. 1290-1301, 2016, https://doi.org/10.1109/JSSC.2016.2527714.

Abouzied et al., "A Fully Integrated Reconfigurable Self-Startup RF Energy-Harvesting System With Storage Capability," IEEE Journal of Solid-State Circuits, vol. 52, No. 3, pp. 704-719, 2017, https://doi.org/10.1109/JSSC.2016.2633985.

Xu et al., "Analysis, Modeling, and Design of a 2.45-GHz RF Energy Harvester for SWIPT IoT Smart Sensors," IEEE Journal of Solid-State Circuits, vol. 54, No. 10, pp. 2717-2729, 2019, https://doi.org/10.1109/JSSC.2019.2914581.

"FCC, Code of Federal Regulations, Title 47, Part 15 . Federal Communications Commission, 2015, https://ecfr.federalregister.gov/." https://www.ecfr.gov/current/title-47/chapter-I/subchapter-A/part-15.

Karthaus et al., "Fully integrated passive UHF RFID transponder IC with 16.7-/spl mu/W minimum RF input power," IEEE Journal of solid-state circuits, vol. 38, No. 10, pp. 1602-1608, 2003, https://doi.org/10.1109/JSSC.2003.817249.

Radin, R. L., "A self-startup ultra-low-voltage boost converter for thermal energy harvesting," Ph.D. thesis, UFSC, Florianópolis, SC, Brazil, 2020, https://repositorio.ufsc.br/handle/123456789/221283.

Nagaveni et al., "Resistance compression dual-band differential CMOS RF energy harvester under modulated signal excitation," IEEE Transactions on Circuits and Systems I: Regular Papers, vol. 67, No. 11, pp. 4053-4062, 2020, https://doi.org/10.1109/TCSI.2020.3006156.

(56) References Cited

OTHER PUBLICATIONS

Cardoso et al., "Analysis of the rectifier circuit valid down to its low-voltage limit," IEEE Transactions on Circuits and Systems I: Regular Papers, vol. 59, No. 1, pp. 106-112, 2011, https://doi.org/10.1109/TCSI.2011.2161366.

* cited by examiner

OPTIMIZATION SYSTEM AND METHOD FOR RADIO FREQUENCY ENERGY HARVESTING

CROSS-REFERENCE TO RELATED APPLICATIONS

The present application claims priority on U.S. Patent Application No. 63/393,078 filed Jul. 28, 2022, the entire contents of which are incorporated herein by reference.

FIELD

The present disclosure generally relates to the field of radio frequency energy harvesting, and more specifically to optimization systems and methods for a radio frequency energy harvester.

BACKGROUND

The Internet of Things (IoT) is an emerging field of technology with numerous applications in everyday life, from smart cities and smart homes to on-body connected devices. For many of these applications, batteries are not a feasible solution, especially for wearable biomedical electronics and implementable devices, due to battery replacement challenges and the possibility of battery leakage. A promising solution for powering devices in the IoT environment is radio frequency (RF) energy harvesting, due to the widespread availability of RF signals near human settlements. A typical radio frequency energy harvester (RFEH) consists of an antenna, a matching network, and a rectifier. The antenna receives incident power (i.e. RF signals) and the matching network performs impedance matching between the antenna and the rectifier input to maximize power transfer from the antenna. The rectifier then converts the captured RF signals into a direct current (DC) output, which can in turn be stored in embedded storage devices for subsequent use.

Designing a low input voltage rectifier for RFEH is however challenging. The available ambient RF energy in free space is indeed limited, and can only support portable electronic devices with very low-power consumption (e.g., from about $10^{-3}$ to about $10^{-6}$ VO. In addition, the power density of the RF signals received at the RFEH's antenna is typically low due to propagation losses (from the RF energy source to the antenna), which can be aggravated by multi-path fading effects, and to limits imposed on RF power emission as a result of human health and safety regulations. Accordingly, there remains a need for improvement.

SUMMARY

In accordance with one aspect, there is provided an optimization method for a radio frequency energy harvester (RFEH), the RFEH comprising an antenna configured to receive power from a radio frequency (RF) energy source, a multi-stage cross-coupled rectifier configured to convert the power received at the antenna to a direct current (DC) output voltage, and a matching network performing impedance matching between the antenna and an input of the rectifier. The method comprises: (a) receiving a target value for the power received at the antenna, (b) selecting a number of stages for the rectifier from a first range of values, and selecting a transistor drain current for the rectifier from a second range of values, (c) determining, based on the number of stages and the transistor drain current, a computed value of the power received at the antenna, (d) determining an input voltage of the rectifier at which the computed value of the power received at the antenna matches the target value, (e) determining the output voltage of the rectifier based on the input voltage, the number of stages, and the transistor drain current, (f) when at least one additional value from the first range of values and/or the second range of values remains to be selected, incrementing the number of stages and/or the transistor drain current, and repeating steps (c) to (e), (g) when all values from the first range of values and the second range of values are selected, determining a final number of stages and a final transistor drain current at which the output voltage of the rectifier is highest, and (h) outputting the final number of stages and the final transistor drain current.

In accordance with another aspect, there is provided an optimization system for a radio frequency energy harvester (RFEH), the RFEH comprising an antenna configured to receive power from a radio frequency (RF) energy source, a multi-stage rectifier configured to convert the power received at the antenna to a direct current (DC) output voltage, and a matching network performing impedance matching between the antenna and an input of the rectifier. The system comprises at least one processing unit and at least one non-transitory computer-readable memory having stored thereon program instructions executable by the processing unit for: (a) receiving a target value for the power received at the antenna, (b) selecting a number of stages for the rectifier from a first range of values, and selecting a transistor drain current for the rectifier from a second range of values, (c) determining, based on the number of stages and the transistor drain current, a computed value of the power received at the antenna, (d) determining an input voltage of the rectifier at which the computed value of the power received at the antenna matches the target value, (e) determining the output voltage of the rectifier based on the input voltage, the number of stages, and the transistor drain current, (f) when at least one additional value from the first range of values and/or the second range of values remains to be selected, incrementing the number of stages and/or the transistor drain current, and repeating steps (c) to (e), (g) when all values from the first range of values and the second range of values are selected, determining a final number of stages and a final transistor drain current at which the output voltage of the rectifier is highest, and (h) outputting the final number of stages and the final transistor drain current.

In accordance with another aspect, there is provided a radio frequency energy harvester (RFEH) comprising an antenna configured to receive power from a radio frequency (RF) energy source, a plurality of combined multi-stage cross-coupled rectifiers, each rectifier configured to convert the power received at the antenna to a direct current (DC) output voltage, at least one matching network configured to perform impedance matching between the antenna and an input of each rectifier, at least one processing unit, and at least one non-transitory computer-readable memory having stored thereon program instructions executable by the processing unit for, for each rectifier: (a) receiving a target value for the power received at the antenna, (b) selecting a number of stages for the rectifier from a first range of values, and selecting a transistor drain current for the rectifier from a second range of values, (c) determining, based on the number of stages and the transistor drain current, a computed value of the power received at the antenna, (d) determining an input voltage of the rectifier at which the computed value of the power received at the antenna matches the target value, (e) determining the output voltage of the rectifier based on the input voltage, the number of stages, and the transistor drain current, (f) when at least one additional value from the first range of values and/or the second range of values remains to be selected, incrementing the number of stages and/or the transistor drain current, and repeating steps (c) to (e), (g) when all values from the first range of values and the second range of values are selected, determining a final number of stages and a final transistor drain current at which the output voltage of the rectifier is highest, and (h) outputting the final number of stages and the final transistor drain current.

Many further features and combinations thereof concerning embodiments described herein will appear to those skilled in the art following a reading of the instant disclosure.

DESCRIPTION OF THE FIGURES

In the figures.

It will be noticed that throughout the appended drawings, like features are identified by like reference numerals.

DETAILED DESCRIPTION

Described herein are optimization systems and methods for a radio frequency energy harvester (RFEH) comprising a multi-stage rectifier circuit coupled to a receiving antenna through a matching network. Optimal values for the rectifier circuit parameters, namely the rectifier's number (N) of stages and transistor drain current ($I_{SEQ}$), are determined, with the available power at an input of the receiving antenna being set as a constraint, such that the rectifier's output voltage ($V_{OUT}$) is maximized.

Figure 1A:
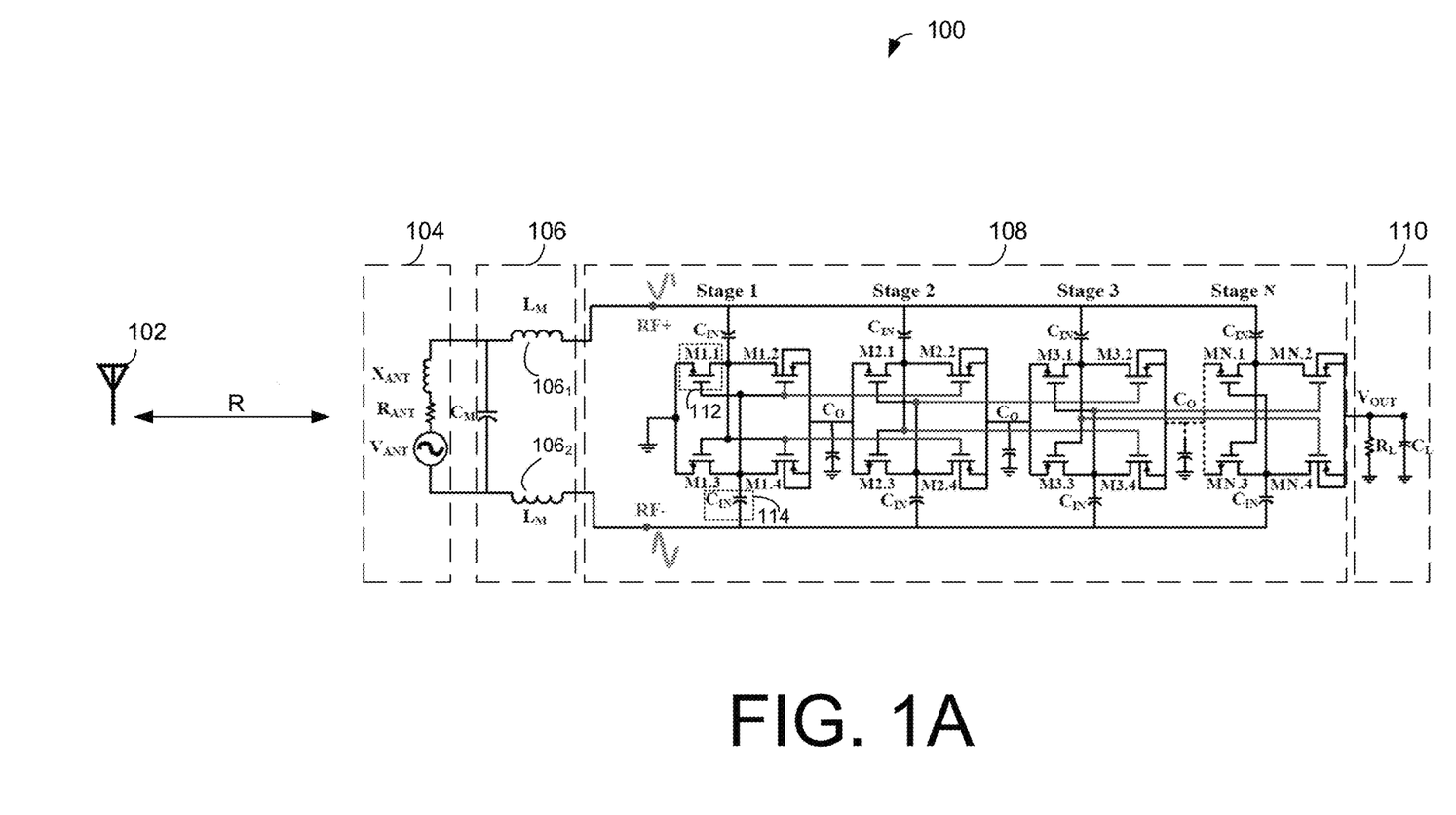
FIG. 1A is a schematic diagram of a radio frequency energy harvester (RFEH), in accordance with an illustrative embodiment.
Figure 1B:
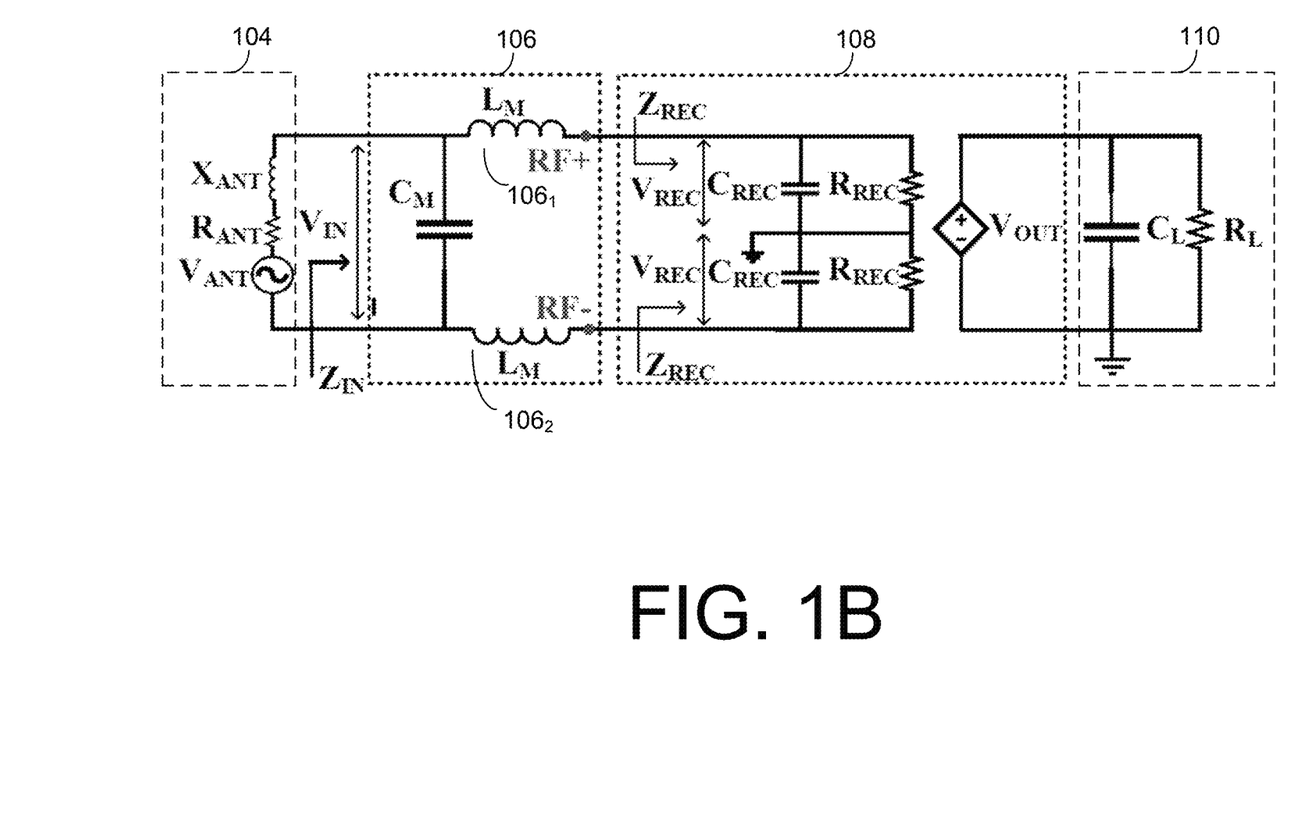
FIG. 1B is an equivalent electrical model of the RFEH of FIG. 1A, in accordance with an illustrative embodiment.

Referring to FIG. 1A, a RFEH 100 will now be described, in accordance with one embodiment. FIG. 1B illustrates an equivalent electrical model of the RFEH 100 of FIG. 1A. The RFEH 100 exploits electromagnetic waves as a power source and behaves as an RF-DC converter by extracting power from radio waves transmitted by an energy source. As illustrated in FIG. 1A, the energy source is a transmitting antenna 102 that transmits electromagnetic waves (i.e. RF signals) across a distance R to a receiving antenna 104 of the RFEH 100, which in turn captures (i.e. harvests) energy from the RF signals sent by the transmitting antenna 102. In addition, any suitable antenna that is compact, of small size, and implantable (e.g., for biomedical applications) may be used for the receiving antenna 104. The RFEH 100 further comprises a matching network 106, a rectifier 108, and a load 110. The REFH 100 may find use in a variety of applications including, but not limited to, battery-less systems such as IoT devices, wearable devices, wireless portable devices, wireless sensor networks (WSNs), and the like.

As shown in FIG. 1B, the receiving antenna 104 can be represented by a voltage source $V_{ANT}$, a series internal resistance $R_{ANT}$ and a reactance $X_{ANT}$. The power $P_{AV}$ available at the input of (i.e. harvested by or received at) the receiving antenna 104 is given by:

$$P_{AV} = P_{ANT} = \left(\frac{V_{ANT}}{\sqrt{2}}\right)^2 \left|\frac{Z_{IN}}{Z_{IN}+Z_{ANT}}\right|^2 Re\left\{\frac{1}{Z_{IN}}\right\} \quad (1)$$

where the input impedance $Z_{IN}$ of the matching network 106 is given by $Z_{IN}=R_{IN}+jX_{IN}$, with $X_{IN}$ being the reactance of the matching network 106 and $R_{IN}$ being the resistance of the matching network 106, and where the input impedance $Z_{ANT}$ of the 145 receiving antenna 104 is given by $Z_{ANT}=R_{ANT}+jX_{ANT}$.

For an ideal matching network 106, the reactance $X_{ANT}$ of the receiving antenna 104 is cancelled by the reactance $X_{IN}$ of the matching network 106, and the input impedance $Z_{IN}$ of the matching network 106 equals the antenna equivalent series resistance $R_{ANT}$, i.e. $Z_{IN}=R_{ANT}$. Thus, the amplitude of the alternating current (AC) input signal obtained at the 150 receiving antenna 104 is given by:

$$V_{ANT}=\sqrt{8 \times R_{ANT} \times P_{AV}} \quad (2)$$

The matching network 106 is interposed between the receiving antenna 104 and the rectifier 108. The matching network 106 may be implemented using a differential L-network topology comprising inductors $106_1$ and $106_2$ having inductances $L_M$. It should be understood that the matching network 106 may also be implemented using capacitors (not 155 shown). In some embodiments, the matching network 106 is provided off-chip. The matching network 106 performs impedance matching between the receiving antenna 104 and the rectifier 108 in order to improve the RFEH's overall power conversion efficiency, which is a measure of how efficiently the RF input power (harvested by the receiving antenna 104) is transformed into DC output power. The rectifier 108 receives incident power via the receiving 160 antenna 104, with power transfer from the receiving antenna 104 to the rectifier 108 being maximized and reflection losses being minimized through the use of the matching network 106.

Besides matching the input of the rectifier 108 with the receiving antenna 102, the matching network 106 may also perform passive voltage boosting of the AC signals 165 incoming at the receiving antenna 104, such signals (also referred to herein as "low-amplitude" signals) typically having an amplitude below a predetermined amplitude threshold. This is achieved by the matching network 106 introducing a boosting factor $A_{V,boost}$. Since the quality factor Q of the inductors $106_1$ and $106_2$ of the matching network 106 (i.e. the ratio of each inductor's inductive reactance to its resistance at a given 170 frequency) can limit the boosting factor $A_{V,boost}$, it is desirable to use inductors $106_1$ and $106_2$ with the highest quality factor Q possible in order to maximize passive voltage boosting by limiting the losses in the matching network 106. Indeed, the higher the quality factor Q of the inductors $106_1$ and $106_2$, the closer the inductors $106_1$ and $106_2$ approach the behavior of ideal inductors.

For an ideal matching network where the equivalent input impedance from the matching network 106 equals the impedance of the receiving antenna 104 (i.e. $Z_{IN}=R_{ANT}$) and where the input power at the matching network 106 is equal to the output power, the boosting factor $A_{V,boost}$ provided by the matching network 106 is given by:

$$A_{V,boost} = \frac{V_{REC}}{\frac{V_{ANT}}{2}R} = \sqrt{\frac{R_{REC}}{2R_{ANT}}} = \frac{\sqrt{Q^2+1}}{2} \cong \frac{Q}{2}(R_{REC} \gg R_{ANT}). \quad (3)$$

where Q is the quality factor of the L matching network 106. In one embodiment, the quality 180 factor Q depends on the resistance $R_{ANT}$ of the receiving antenna 104 and on the load resistance $2R_{REC}$ of the rectifier 108. For an ideal matching network, the available power becomes (combining equations (1) and (3)):

$$P_{AV} = \frac{V_{REC}^2}{R_{REC}} \quad (4)$$

From equation (4), it can be seen that, for a given $P_{AV}$, it is desirable to maximize $R_{REC}$ to increase the passive voltage boosting (i.e. the boosting factor $A_{V,boost}$) introduced by 185 the matching network 106, thus improving the overall sensitivity of the RFEH 100. As used herein, the term "sensitivity" refers to the minimum RF input from which energy can be harvested by the RFEH as in 100 to feed the load 110. In other words, sensitivity refers to the lowest RF input power that allows the RFEH 100 to convert RF energy into DC output power.

As shown in FIG. 1A, the rectifier 108 comprises a plurality of stages. Any suitable number (N) of stages may apply, depending on the application. In some embodiments, the rectifier 108 comprises N=10 stages and each stage of the rectifier 108 comprises a plurality of semiconductor devices (i.e. transistors) 112 and a plurality of input coupling capacitors 114. In some embodiments, the transistors 112 are metal-oxide-semiconductor field-effect transistors (MOSFETs). In the embodiment illustrated in FIG. 1A, each stage of the rectifier 108 comprises four (4) transistors 112 (labelled in FIG. 1A as $M_{S,1}$, $M_{S,2}$, $M_{S,3}$ and $M_{S,4}$ for a given stage S, where S=1, . . . , N), of which two (2) are P-type metal-oxide-semiconductor (PMOS) transistors and two (2) are N-type metal-oxide-semiconductor (NMOS) transistors. In some embodiments, the rectifier 108 comprises NMOS transistors implemented with zero-$V_T$ devices and PMOS transistors implemented with low-$V_T$ devices.

In the illustrated embodiment, the rectifier 108 has a cross-coupled topology to compensate for the transistor threshold voltage ($V_T$). The rectifier 108 is self-compensated. Although the rectifier 108 is illustrated and described herein as having a cross-coupled topology, other topologies may apply, including, but not limited to, the Greinacher doubler (also known as the half-wave voltage doubler) topology and the Dickson topology. In the proposed cross-coupled topology, a dynamic bias voltage, which is in opposite phase to the signal being rectified, is applied to the control terminals (also referred to herein as the "gates") of the transistors 112. In other words, the signal being rectified is in counterphase with the signal applied to the gates of the transistors 112, compensating the effects of the transistors' threshold voltage ($V_T$), which is a variable that affects the performance of the rectifier 108, particularly at low input power levels. In this manner, conduction losses associated with the drop in the transistor's forward voltage (i.e. the amount of voltage needed to get current to flow across the transistor 112), and the losses associated with the transistor's reverse leakage current (i.e. the current from the transistor 112 when the transistor 112 is reverse biased) can be decreased, thus making the transistors 112 more efficient in their on and off states. It is further proposed herein to add a static bias voltage to the dynamic bias voltage in order to increase the transistor drain current ($I_{SEQ}$), thus reducing the forward voltage drop across the transistors 112. The static compensation may further allow to reduce the widths of the transistors 112 for a same drain current, thus reducing the overall silicon area occupied by the rectifier 108 on a chip and decreasing the input capacitance of the rectifier 108.

As illustrated in FIG. 1A, the proposed $V_T$ compensation may be achieved by cross-connecting the gates of the transistors 112 of a given rectifier stage using a signal from the previous rectifier stage, for all rectifier stages except the first stage for which no previous stage is available for connection. In particular, the gate of a PMOS transistor in one stage of the rectifier 108 is connected to the opposite phase of the input signal into the previous stage of the rectifier 108. This is illustrated in FIG. 1A, where each rectifier stage comprises a first pair of transistors 112 (labelled in FIG. 1A M2.1 and M2.2 for stage 2) and a second pair of transistors 112 (labelled in FIG. 1A M2.3 and M2.4 for stage 2). For the first pair of transistors 112, the current sink terminal (also referred to herein as the "drain") of the NMOS transistor (M2.1) is connected to the drain of the PMOS transistor (M2.2) and connected to the positive phase (labelled RF+ in FIG. 1A) of the RF input signal (from the antenna 104) through a first one of the capacitors 114. For the second pair of NMOS and PMOS transistors 112, the drain of the NMOS transistor (M2.3) is connected to the drain of the PMOS transistor (M2.4) and connected to the negative phase (labelled RF− in FIG. 1A) of the RF input signal through a second one of the capacitors 114. Thus, each capacitor 114 has its first terminal connected to an input line (RF+ or RF−) and its second terminal connected to the drain of the NMOS transistor and the PMOS transistor of a pair of transistors 112. In addition, the gate of the NMOS transistor (M2.1) in the first pair is connected to the drains of the two transistors (M2.3, M2.4) in the second pair and the gate of the NMOS transistor (M2.3) in the second pair is connected to the drains of the two transistors (M2.1, M2.2) in the first pair. Furthermore, the gate of the PMOS transistor (M2.2) in the first pair is connected to the drains of the two transistors (M1.3, M1.4) of the second pair in a previous stage (stage 1) of the rectifier circuit and the gate of the PMOS transistor (M2.4) in the second pair is connected to the drains of the two transistors (M1.1, M1.2) of the first pair in the previous stage (stage 1) of the rectifier circuit. In this manner, the AC component of the bias potential remains the same in all stages and the DC level is lowered by $V_{OUT}/N$ for each stage, providing a static compensation of $V_T$.

The rectifier 108 converts the incoming RF signal (provided at input lines denoted RF+ and RF− in FIGS. 1A and 1B) from the matching network 106 to an output DC voltage that may be stored in a storage device (not shown), for instance in embedded rechargeable batteries (such as lithium-ion batteries) or supercapacitors. The storage device may act as an energy reservoir maintaining operation when the RF power flux is unavailable, for instance when the distance between the RFEH 100 and the transmitting antenna 102 is above a threshold distance. The output DC voltage ($V_{OUT}$) is then provided to the load 110 which may be any suitable device including, but not limited to, a wearable device and an IoT device. In the illustrated embodiment, the load 110 is represented using a resistive element $R_L$ in parallel with a capacitive element $C_L$ and the voltage $V_{OUT}$ across the load 110 is represented using a dependent voltage source (see FIG. 1A). The resistive element $R_L$ and the capacitive element $C_L$ are connected in parallel, between the current generating terminal (also referred to as the "source") of the PMOS transistors (MN.2, MN.4) of the last stage (stage N) and ground. In some embodiments, the capacitive element $C_L$ may act as an energy storage and the resistive element $R_L$ may represent current consumption of the load 110 (e.g., of the wearable or IoT device).

It can be noted that the output DC voltage ($V_{OUT}$) is related to the number of rectifier stages (N) and the transistor drain current ($I_{SEQ}$) according to the following equation:

$$V_{OUT} = 2N\phi_t \ln \frac{I_0\left(\frac{2V_{REC}}{n\phi_t}\right) - \frac{I_L}{2I_{SEQ}}}{I_0\left(\frac{(2-n)V_{REC}}{n\phi_t}\right)} \quad (5)$$

where $I_L$ is the output current of the RFEH 100, n is the slope factor of the transistors 112, $\phi_t$ is the thermal voltage of the transistors 112, and $I_0(z)$ is the modified Bessel function of the first kind of order zero. It can be seen from equation (5) that $V_{REC}$ influences $V_{OUT}$.

In addition, N and $I_{SEQ}$ are related to the input resistance $R_{REC}$ of the N-stage cross-coupled rectifier as in 108 according to the following equation:

$$R_{REC} = \frac{V_{REC}}{2NI_{SEQ}} \quad (6)$$

$$\left\{ \left[ \frac{I_L}{I_{SEQ}} - 2I_0\left(\frac{2V_{REC}}{n\phi_t}\right) \right] \frac{I_1\left(\frac{(2-n)V_{REC}}{n\phi_t}\right)}{I_0\left(\frac{(2-n)V_{REC}}{n\phi_t}\right)} + 2I_1\left(\frac{2V_{REC}}{n\phi_t}\right) \right\}$$

where $I_1(z)$ is the modified Bessel function of the first kind of order one. It can be seen from equation (6) that $V_{REC}$ influences $R_{REC}$.

Figure 2:
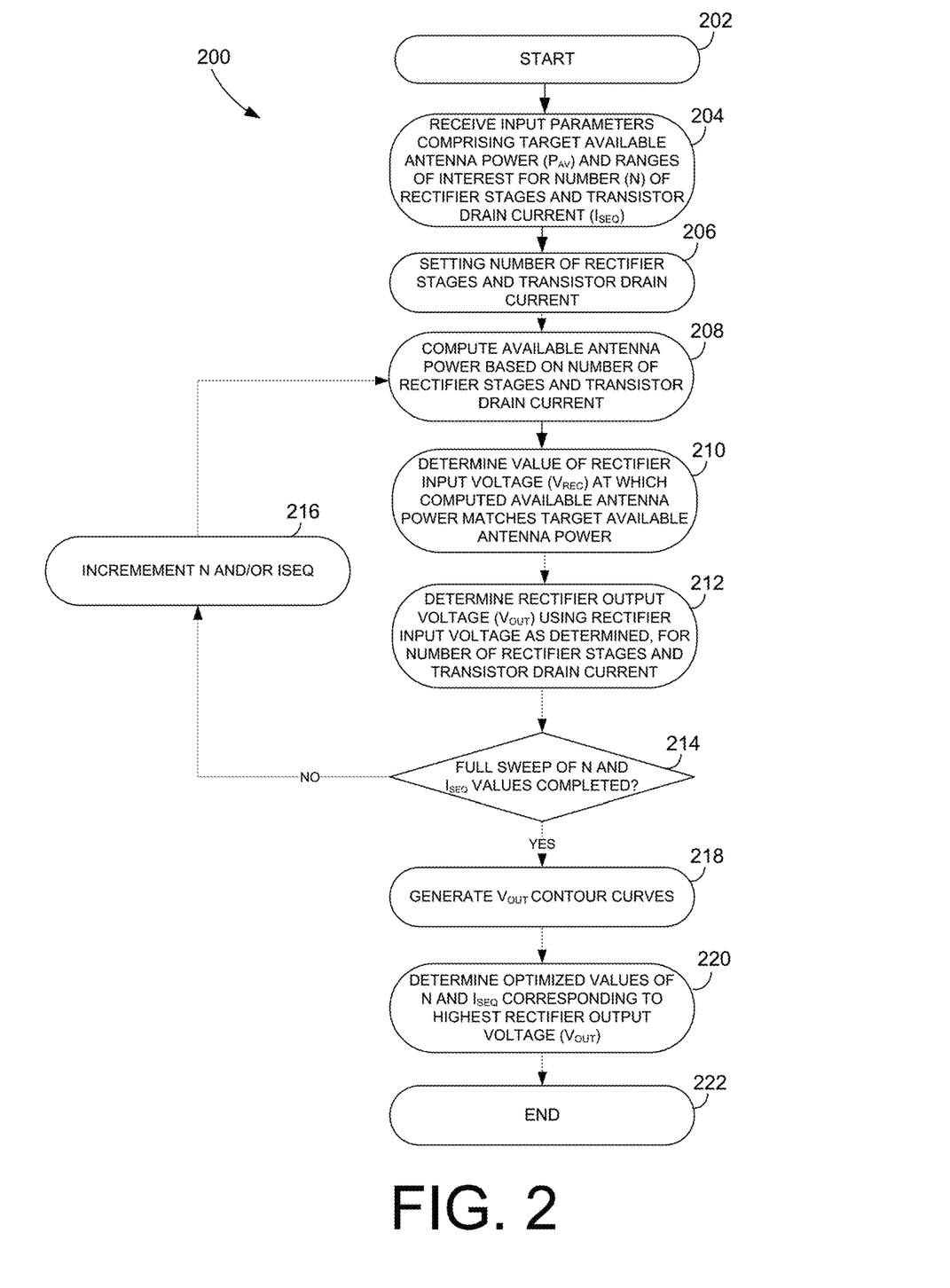
FIG. 2 is a flowchart of an optimization method for an RFEH, in accordance with an illustrative embodiment.

Referring now to FIG. 2, an optimization method 200 for a RFEH, for instance the RFEH 100 comprising the multi-stage rectifier 108 of FIGS. 1A and 1B, will now be described.

The method 200 may be used to optimize circuit parameters of the rectifier as in 108 for low-power operation, thus increasing the sensitivity and power conversion efficiency of the REFH 100 for low RF power levels (i.e., power levels below about −25 dBm). By improving sensitivity, the operating distance may be increased, and by increasing the power conversion efficiency, the output power of the RFEH 100 may be increased for a same input power. In order to design a system that operates over a wide range of RF input power, it is desirable to maximize sensitivity. In a RFEH as in 100, due to propagation losses, the receiving antenna 104 receives low RF power density. Based on the Friis transmission equation, the power ($P_{AV}$) available at the input of the receiving antenna 104 is attenuated at the rate of $1/R^2$ in free space, where R is the distance from the transmitting antenna 102 to the receiving antenna 104. Attenuation can be aggravated by multi-path fading effects.

The systems and methods described herein allow to improve the sensitivity of the RFEH 100 to low ambient RF power. Increasing sensitivity and efficiency as such low power levels in turn allows to increase the range of input power, which is a desirable characteristic for a RFEH as in 100 since it enables energy harvesting at low RF signal power. In particular, in one embodiment, the proposed method 200 may allow to optimize the design of a RFEH as in 100 for a specified available power ($P_{AV}$), to values that yield a maximum output voltage ($V_{OUT}$). The efficiency of the RFEH as in 100 for a given operating condition may thus be maximized.

The method 200 may be used to optimize at least one parameter of the rectifier circuit in order to maximize an output value of the RFEH 100, while factoring in at least one constraint. In one embodiment, the at least one circuit parameter to optimize comprises a number of stages N of the rectifier and a drain current $I_{SEQ}$ associated with the semiconductor devices (e.g., the transistors 112 of FIG. 1B) found in the rectifier, the output value to be maximized is the rectifier's output voltage (labelled $V_{OUT}$ in FIGS. 1A and 1B), and the at least one constraint is the rectifier's available power ($P_{AV}$). Other circuit parameter(s) may be optimized, other output(s) may be maximized, and other constraint(s) may apply, depending on the topology of the rectifier 108 and on the application for which the RFEH 100 is used. In this manner, rectifier performance (e.g., sensitivity, efficiency, and/or maximum voltage) may be optimized for a given target.

Still referring to FIG. 2, the method 200 comprises, following start at step 202, receiving input parameters at step 204. The input parameters may be user-defined and comprise the at least one constraint (i.e. a target value for the available power ($P_{AV}$)). The input parameters obtained at step 204 may also comprise ranges of interest for the number (N) of rectifier stages and for the transistor drain current ($I_{SEQ}$), which is indicative of the sizing of the rectifier's transistors as in 112. The transistor drain current may be assumed to be the same for both NPOS and PMOS transistors. For example, the range of interest for N may be 1 to 40, and the range of interest for $I_{SEQ}$ may be $10^{-18}$ to $10^{-6}$ A. In some embodiments, representative samples of N and $I_{SEQ}$ values may be selected from their respective ranges of interest and provided as input parameters at step 204. In other embodiments, the N parameter may be exhaustively sampled from its range of interest, e.g. N=1, 2, . . . , 40. Depending on the application, other suitable values for N and $I_{SEQ}$ may be selected as ranges of interest and obtained at step 204. Step 204 may further comprise obtaining the output current ($I_L$) of the RFEH 100 rectifier resistance and a desired (or target) output voltage value ($V_{OUT}$). It should also be understood that, in some embodiments and depending on the target, the RFEH output current and the desired output voltage may be the only parameters received at step 204 and based on which the RFEH 100 is optimized.

At step 206, a number (N) of rectifier stages and a transistor drain current ($I_{SEQ}$) are selected from their corresponding ranges of interest as obtained at step 204. For example, in one embodiment, step 206 might comprise setting as initial values N=1 and $I_{SEQ}=10^{-18}$ A. At step 208, the available antenna power ($P_{AV}$) is determined (i.e. computed) based on the number of rectifier stages and the transistor drain current (i.e. based on the initial values set at step 206), using equations (4) and (6) above. The value of the rectifier input voltage ($V_{REC}$) at which the available antenna power ($P_{AV}$) computed at step 208 matches the target available antenna power ($P_{AV}$) specified at step 204 is then determined at step 210. At step 212, the value of $V_{REC}$ as determined at step 210 is used to determine the rectifier output voltage ($V_{OUT}$) for the number of rectifier stages and the transistor drain current (i.e. for the initial values set at step 206), using equations (5) and (6) above.

After the rectifier output voltage $V_{OUT}$ has been determined at step 212, the next step 214 may then comprise assessing whether a full sweep of N and $I_{SEQ}$ values from within their respective ranges of interest (as obtained at step 204) has been completed. If this is not the case, the method 200 may then proceed to step 216 where the values of N and $I_{SEQ}$ are incremented to obtain new value(s). Following with the previous example, when step 206 comprises setting as initial values N=1 and $I_{SEQ}=10^{-18}$, step 216 comprises setting N=2 and $I_{SEQ}=10^{-17}$ A. It should however be understood that any suitable increment may apply at step 216. In addition, only N, only $I_{SEQ}$, or both N and $I_{SEQ}$ may be incremented at step 216. Steps 208 to 212 are then repeated, using the new value of N as the number of rectifier stages and/or the new value of $I_{SEQ}$ as the rectifier drain current.

When it is determined at step 214 that a full sweep of the values of N and $I_{SEQ}$ has been completed, $V_{OUT}$ contour curves (described further below with reference to FIG. 3) as a function of N and $I_{SEQ}$ may be generated at step 218, using the $V_{OUT}$ values computed at step 212. The contour curves may be generated at step 218 in real-time and output using any suitable output means, such as rendered on a computer screen or the like. At step 220, the contour curves are then used to determine optimized (i.e. final) values of N and $I_{SEQ}$ for which the output voltage $V_{OUT}$ is highest. In some embodiments, the method 200 may be used to optimize the circuit parameters of the RFEH 100 for the 902-928 MHz frequency range, corresponding to the Industrial Scientific Medical (ISM) band in ITU Region 2, with a center frequency of 915 MHz. Other frequency ranges may also apply, for instance the 896 MHz, 900 MHz, or 2.4 GHz frequency ranges.

Step 220 may further comprise outputting the final values of N and $I_{SEQ}$ using any suitable output means, such as a computer screen or the like. The final values may also be communicated in any other suitable manner and/or stored in a suitable storage device (e.g., in memory). The optimized values of N and $I_{SEQ}$ selected at step 220 may then be used to implement a RFEH, for instance the RFEH 100 of FIGS. 1A and 1B. For this purpose, the method 200 may also comprise outputting instructions to cause the manufacture of an actual RFEH as in 100 having the optimized values of N and $I_{SEQ}$ as part of its rectifier circuitry design. For example, the method 200 may output instructions to cause the circuitry design of the RFEH 100 to be implemented on an integrated circuit (or chip), using a Complementary Metal-Oxide-Semiconductor (CMOS) fabrication process. In some embodiments, the rectifier 108 may indeed be implemented using 130 nm CMOS technology. Other technologies, including, but not limited to, a 65 nm or a 180 nm fabrication process, may also apply. It should however be understood that, although the method 200 has been described with reference to the RFEH 100, other RFEH circuit topologies may be considered and the method 200 may apply to such topologies, with the rectifier's output voltage ($V_{OUT}$) and input resistance ($R_{in}$) being the drive for other rectifier topologies. The method 200 then ends at step 222.

Figure 3:
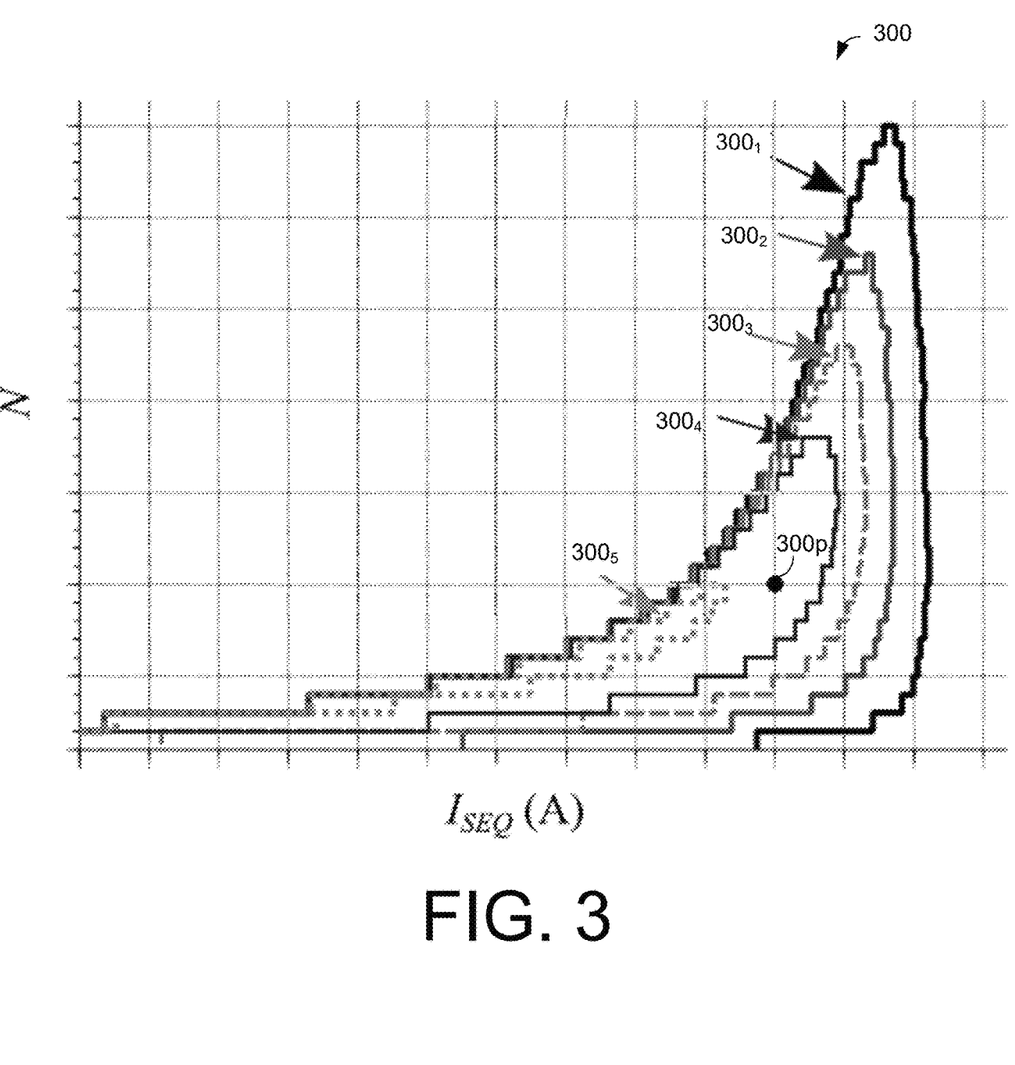
FIG. 3 is a plot illustrating output voltage curves generated using the method of FIG. 2, in accordance with an illustrative embodiment.

FIG. 3 shows an illustrative plot 300 of $V_{OUT}$ countour curves as a function of N and $I_{SEQ}$, as generated at step 218 of FIG. 2 The illustrated plot 300 is generated for a given set of input parameters (e.g., $P_{AV}=-30$ dBm, $I_L=500$ nA, $\phi_t=25$ mV, n=1), as obtained at step 204 of FIG. 2, and comprises a plurality of contour curves (also referred to as "level curves") $300_1$, $300_2$, $300_3$, $300_4$, and $300_5$ each generated at step 218 as a function of the number of rectifier stages (N) and the transistor drain current ($I_{SEQ}$). Although five (5) contour curves are shown in FIG. 2, it should be understood that any suitable number of output curves may be plotted. Each contour curve $300_1$, $300_2$, $300_3$, $300_4$, and $300_5$ is indicative of values for N and $I_{SEQ}$ that, when chosen to implement the rectifier 108 of FIGS. 1A and 1B, allow to meet a minimum specification of the DC output voltage ($V_{OUT}$). The optimized value would be any value of $I_{SEQ}$ inside (i.e. enclosed by) a given contour curve $300_1$, $300_2$, $300_3$, $300_4$, and $300_5$. For example, the contour curve $300_1$ may correspond to $V_{OUT} \geq 0.25$ V, the contour curve $300_2$ to $V_{OUT} \geq 0.5$ V, the contour curve $300_5$ to $V_{OUT} \geq 0.75$ V, the contour curve $300_4$ to $V_{OUT} \geq 1$ V, and the contour curve $300_5$ to $V_{OUT} \geq 1.5$ V. At least one point ($I_{SEQ}$, N) enclosed by a given contour curve may be defined that generates a specific output voltage. For example, an exemplary design point 300p may correspond to ($I_{SEQ}=10^{-8}$, N=10) and fall within contour curve $300_4$, i.e. having $V_{OUT} \geq 1$ V. Since the design point 300p falls outside of the contour curve $300_5$, at point 300p (i.e. for $I_{SEQ}=10^{-8}$, N=10), $V_{OUT} \geq 1.5$ V and 1 V$\leq V_{OUT}<1.5$ V. Proper selection of values for N and $I_{SEQ}$, using the $V_{OUT}$ countour curves as in $300_1$, $300_2$, $300_3$, $300_4$, and $300_5$ can therefore allow to design a RFEH as in 110 that achieves a specified rectifier output voltage or a desired range of output voltage values.

In one embodiment, in order to demonstrate the validity of the systems and methods proposed herein, a test chip was implemented with 130 nm CMOS technology, with the proposed rectifier occupying a silicon area of 0.029 mm². Simulations were then performed and measurement results demonstrated a sensitivity of −25.5 dBm for 1V output across a 5 MΩ resistive load (with a power conversion efficiency (PCE) was measured to be above 30%), and −29 dBm for a 100 MΩ resistive load. For The measured peak end-to-end efficiency of the proposed harvester was also found to be 42.4% at −16 dBm input power, delivering 2.19V to a 450 kΩ resistive load. Improved power efficiency was also found at input power levels between −18 and −25 dBm.

Figure 4:
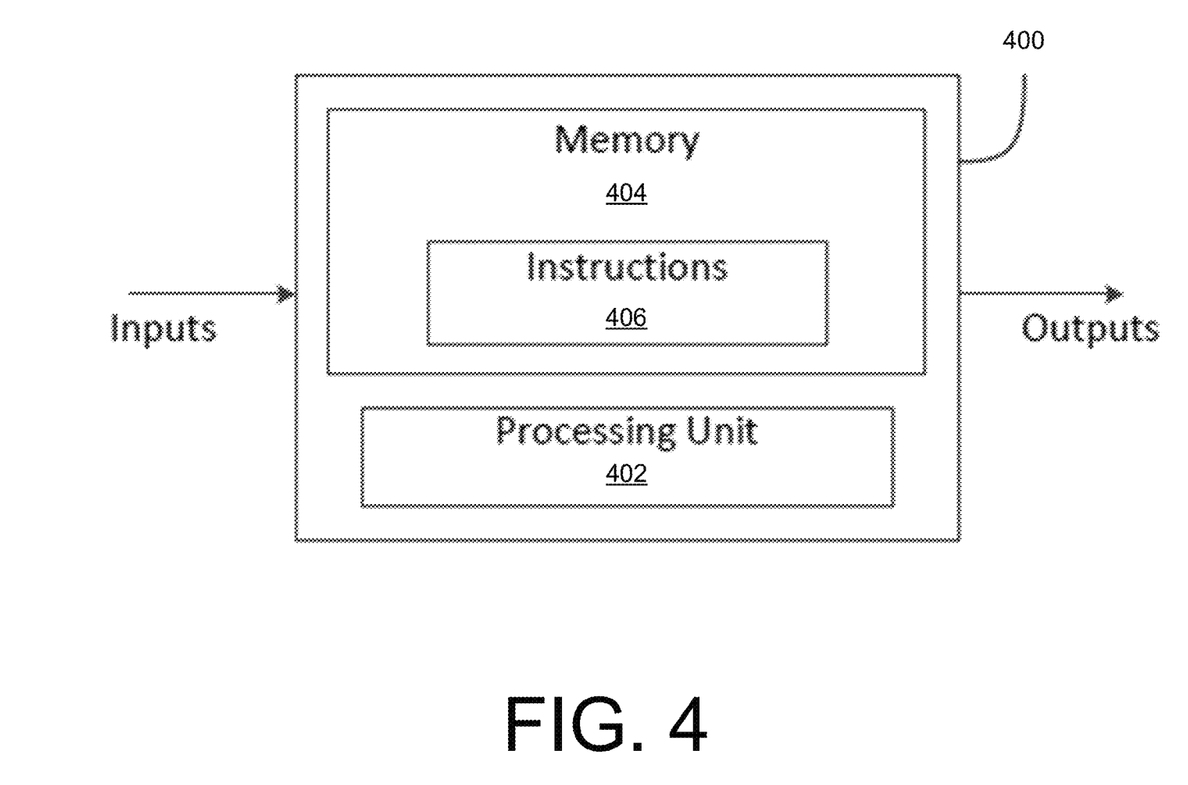
FIG. 4 is a block diagram of an example computing device, in accordance with an illustrative embodiment.

FIG. 4 is a schematic diagram of computing device 400, which may be used to implement the method 200 of FIG. 2. The computing device comprises a processing unit 402 and a memory 404 which has stored therein computer-executable instructions 406. The processing unit may 402 may comprise any suitable devices configured to implement the functionality of the method 200 such that instructions 406, when executed by the computing device 400 or other programmable apparatus, may cause the functions/acts/steps performed by method 200 as described herein to be executed. The processing unit 402 may comprise, for example, any type of general-purpose microprocessor or microcontroller, a digital signal processing (DSP) processor, an integrated circuit, a field programmable gate array (FPGA), a reconfigurable processor, a programmable read-only memory (PROM), or any combination thereof.

The memory 404 may comprise any suitable known or other machine-readable storage medium. The memory 404 may comprise non-transitory computer readable storage medium, for example, but not limited to, an electronic, magnetic, optical, electromagnetic, infrared, or semiconductor system, apparatus, or device, or any suitable combination of the foregoing. The memory 404 may include a suitable combination of any type of computer memory that is located either internally or externally to device, for example random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM) or the like. Memory 404 may comprise any storage means (e.g. devices) suitable for retrievably storing machine-readable instructions 406 executable by the processing unit 402.

Figure 5A:
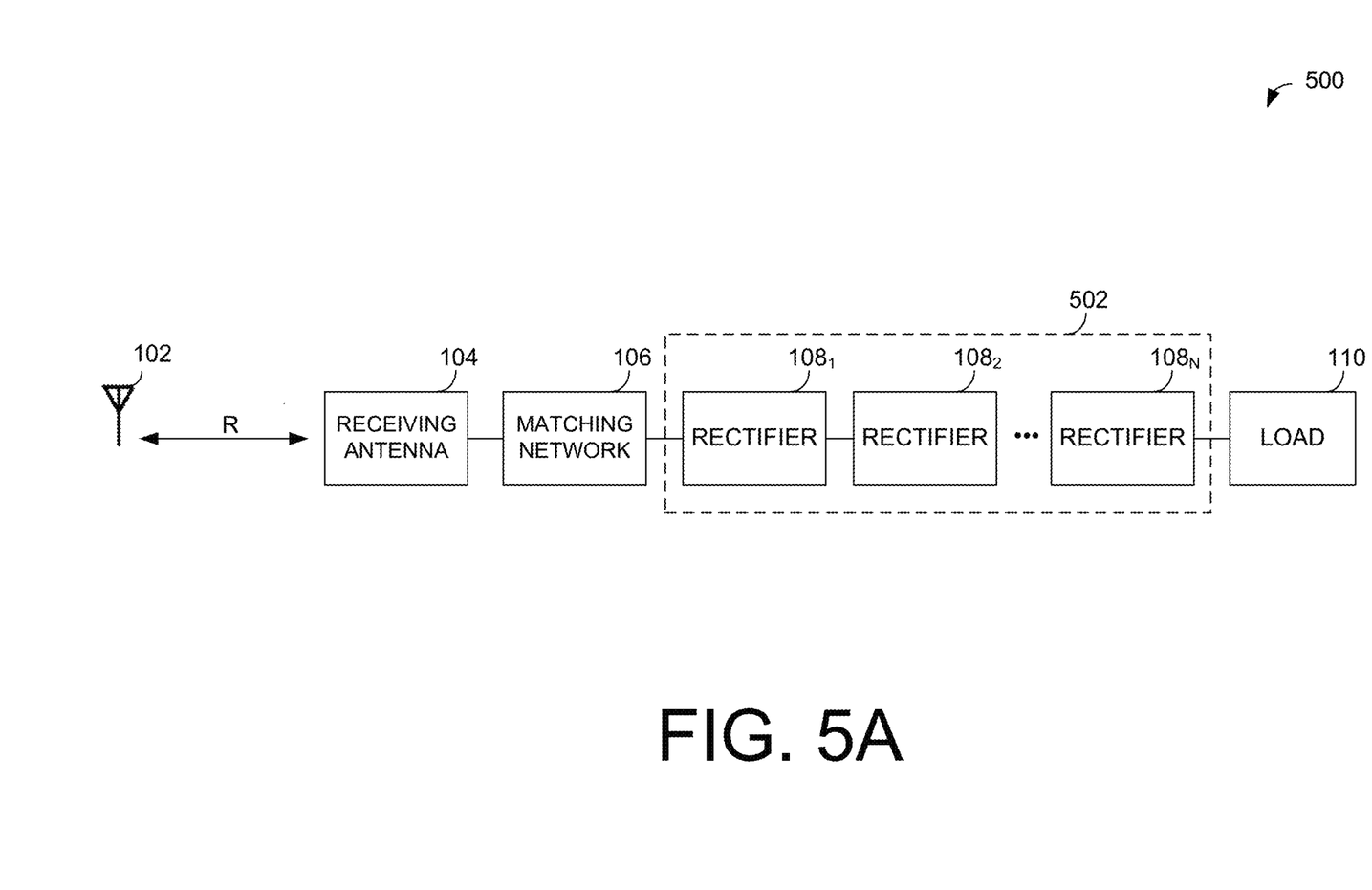
FIG. 5A is a schematic diagram of a first RFEH comprising a multi-rectifier, in accordance with an illustrative embodiment.
Figure 5B:
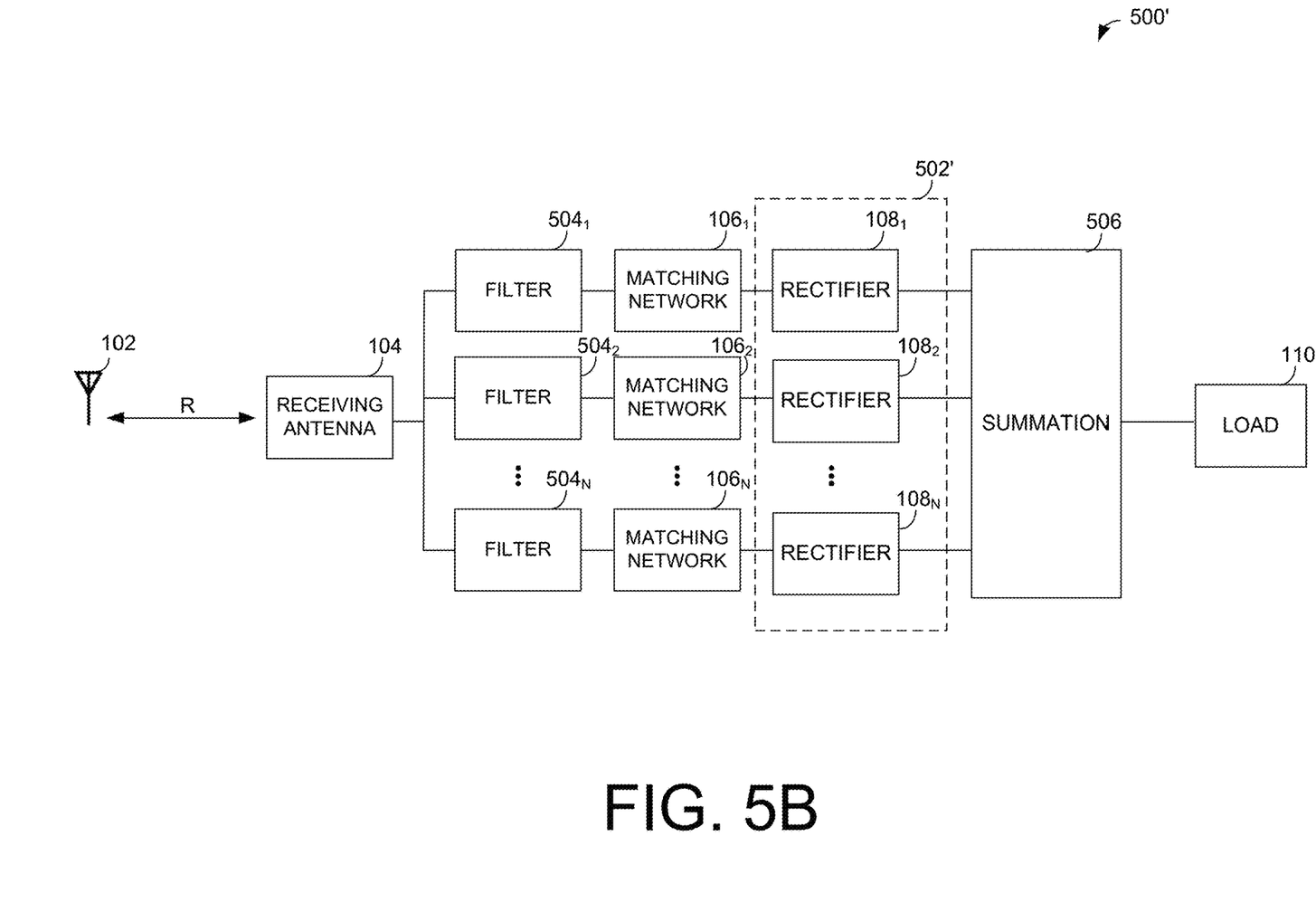
FIG. 5B is a schematic diagram of a second RFEH comprising a multi-rectifier, in accordance with an illustrative embodiment.

Referring now to FIGS. 5A and FIGS. 5B, in one embodiment, the circuit parameters of multiple ones of the rectifier described herein above may be optimized (e.g., using the method 200 described above with reference to FIG. 2) for low-power operation and such rectifiers may be combined together to form an RFEH comprising an optimized multi-rectifier. Such a system may allow to improve efficiency over a wide range of RF input power (e.g., between about −18 dBm and about −28 dBm), even for low input power, due to the combination of jointly optimized rectifiers.

The rectifiers may be combined using any suitable technique. FIG. 5A illustrates a first RFEH 500, in accordance with one embodiment. The RFEH 500 comprises a multi-rectifier 502 with a number (N) of optimized rectifiers $108_1$, $108_2$, ..., $108_N$ that are serially combined by direct DC serial combination. As described above with reference to FIG. 1A, the transmitting antenna 102 transmits RF signals across a distance R to the receiving antenna 104, which in turn captures energy from the RF signals. The multi-rectifier 502 then receives incident power for transmission to the load 110 via the receiving antenna 104, with power transfer from the receiving antenna 104 to the multi-rectifier 502 being maximized and reflection losses being minimized through the use of the matching network 106. More specifically, an output of each rectifier (e.g., rectifier $108_1$) is fed as an input to a subsequent rectifier (e.g., rectifier $108_2$) and a DC output power of a last one of the plurality of rectifiers (e.g., rectifier $108_N$) is provided to the load 110.

FIG. 5B illustrates a second RFEH 500', in accordance with one embodiment. The RFEH 500' comprises a multi-rectifier 502' with a number (N) of optimized rectifiers $108_1$, $108_2$, ..., 108 N that are combined using diode-based summation. In the embodiment of FIG. 5B, the transmitting antenna 102 transmits RF signals across a distance R to the receiving antenna 104, which in turn captures energy from the RF signals. Incident power is received at the multi-rectifier 502' for transmission to the load 110 via the receiving antenna 104, a number (N) of filters $504_1$, $504_2$, ..., $504_N$ (e.g., band-pass filters), and a number (N) of matching networks $106_1$, $106_2$, ..., $106_N$. Each filter $504_1$, $504_2$, ..., $504_N$ has an input (not shown) connected to the receiving antenna 104 and an output (not shown) connected to an input (not shown) of a corresponding matching network $106_1$, $106_2$, ..., $106_N$. Each filter $504_1$, $504_2$, ..., $504_N$ may be configured to process the receiving antenna's output to remove unwanted components or features. The output (not shown) of each matching network $106_1$, $106_2$, ..., $106_N$ is in turn connected to an input (not shown) of a corresponding rectifier $108_1$, $108_2$, ..., $108_N$. The output of each rectifier $108_1$, $108_2$, ..., $108_N$ is then provided as an input to a summation block 506. The summation block 506 is configured to combine (i.e. sum) the DC output powers of the rectifiers $108_1$, $108_2$, ..., $108_N$ into DC output that is provided to the load 110.

Figure 6:
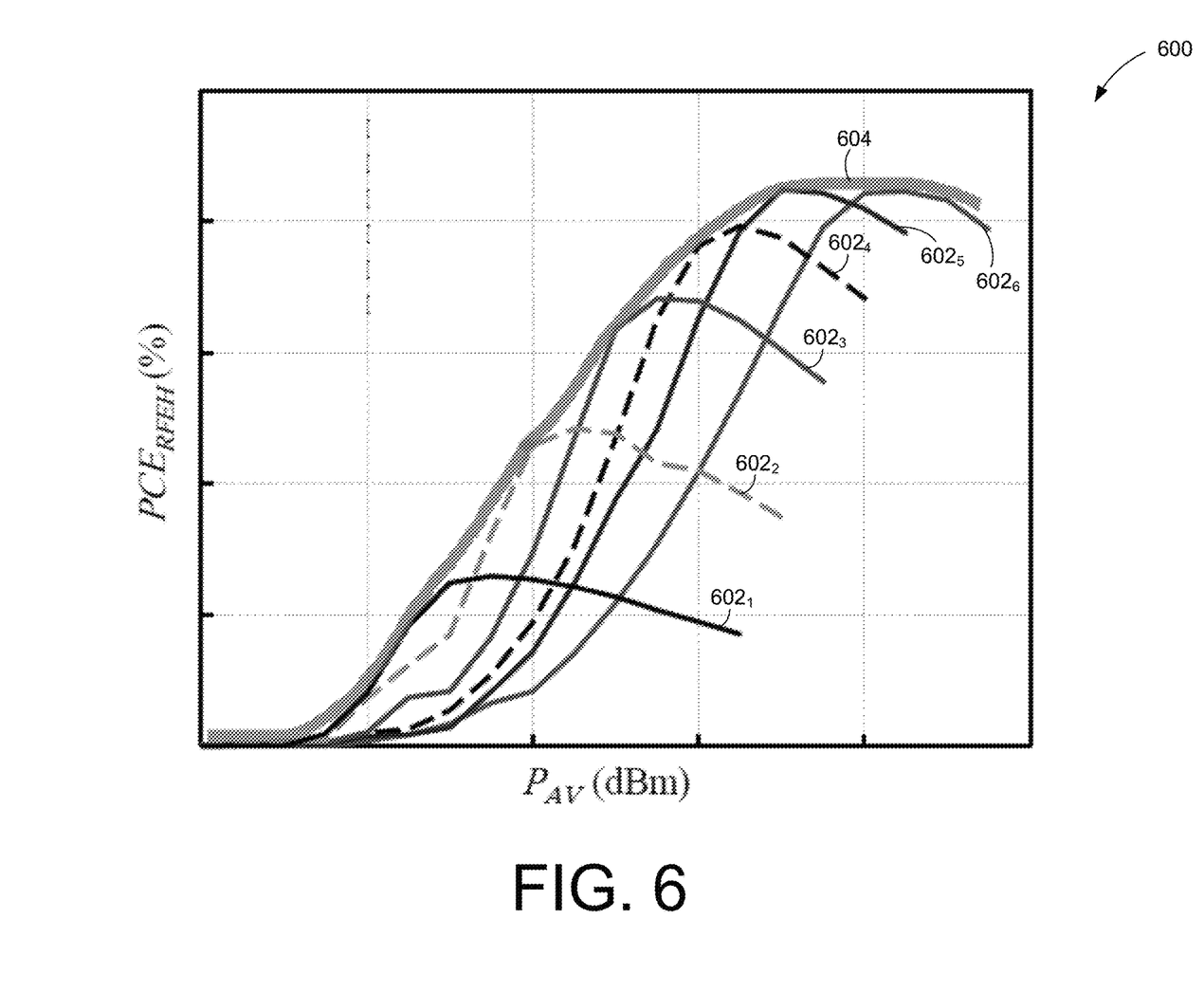
FIG. 6 is a plot illustrating power conversion efficiency (PCE) curves for individual rectifiers and an RFEH comprising a multi-rectifier, in accordance with an illustrative embodiment.

FIG. 6 shows a plot 600 that illustrates results obtained for the proposed multi-rectifier described above with reference to FIGS. 5A and 5B. The plot 600 is for a given input power and assuming each rectifier of the proposed multi-rectifier is optimized (using the systems and methods described herein) for the given input power and a given load. FIG. 6 illustrates curves $602_1$, $602_2$, $602_3$, $602_4$, $602_5$, $602_6$ of PCE as a function of available antenna power ($P_{AV}$), for different rectifiers $108_1$, $108_2$, ..., $108_N$. In the embodiment of FIG. 6, results are shown for N=6 rectifiers that have ben optimized (e.g., using the method 200 described above with reference to FIG. 2) for low-power operation. FIG. 6 also illustrates a curve 604 of PCE as a function of $P_{AV}$ for a multi-rectifier (as in 502 or 502') comprising combined six (6) optimized rectifiers. As can be seen in FIG. 6, the curve 604 follows the envelope of the individual curves $602_1$, $602_2$, $602_3$, $602_4$, $602_5$, $602_6$. In other words, in one embodiment, the multi-rectifier proposed herein exhibits a performance that matches the best of a set of available rectifiers and thus that is above that of any individual rectifier.

The above description is meant to be exemplary only, and one skilled in the art will recognize that changes may be made to the embodiments described without departing from the scope of the invention disclosed. Still other modifications which fall within the scope of the present invention will be apparent to those skilled in the art, in light of a review of this disclosure.

Various aspects of the systems and methods described herein may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments. Although particular embodiments have been shown and described, it will be apparent to those skilled in the art that changes and modifications may be made without departing from this invention in its broader aspects. The scope of the following claims should not be limited by the embodiments set forth in the examples, but should be given the broadest reasonable interpretation consistent with the description as a whole.

What is claimed is:

1. An optimization method for a radio frequency energy harvester (RFEH), the RFEH comprising an antenna configured to receive power from a radio frequency (RF) energy source, at least one multi-stage cross-coupled rectifier configured to convert the power received at the antenna to a direct current (DC) output voltage, and at least one matching network performing impedance matching between the antenna and an input of the at least one rectifier, the method comprising:

(a) receiving a target value for the power received at the antenna;

(b) selecting an initial value of a number of stages for the at least one rectifier from a first range of values, and selecting an initial value of a transistor drain current for the at least one rectifier from a second range of values;

(c) determining, based on the initial value of the number of stages and the initial value of the transistor drain current, a computed value of the power received at the antenna;

(d) determining an input voltage of the at least one rectifier at which the computed value of the power received at the antenna matches the target value;

(e) determining the output voltage of the at least one rectifier based on the input voltage, the initial value of the number of stages, and the initial value of the transistor drain current;

(f) when at least one additional value from at least one of the first range of values and the second range of values remains to be selected, incrementing at least one of the initial value of the number of stages and the initial value of the transistor drain current, and repeating steps (c) to (e);

(g) when all values from the first range of values and the second range of values are selected, determining a final value of the number of stages and a final value of the transistor drain current at which the output voltage of the at least one rectifier is highest; and (h) outputting the final value of the number of stages and the final value of the transistor drain current.

2. The method of claim 1, further comprising outputting, for all values from the first range of values and the second range of values, a plot of the output voltage of the at least one rectifier as a function of the number of stages and the transistor drain current.

3. The method of claim 2, wherein the final value of the number of stages and the final value of the transistor drain current at which the output voltage of the at least one rectifier is highest are selected from the plot.

4. The method of claim 3, further comprising outputting instructions for causing an actual RFEH comprising an actual rectifier having the final value of the number of stages and the final value of the transistor drain current to be manufactured.

5. The method of claim 4, wherein the instructions are output for causing the actual RFEH to be implemented on an integrated circuit using a Complementary Metal-Oxide-Semiconductor (CMOS) fabrication process.

6. The method of claim 1, wherein the computed value of the power received at the antenna is determined as follows:

$$P_{AV} = \frac{V_{REC}^2}{R_{REC}}$$

where $P_{AV}$ is the computed value of the power received at the antenna, $V_{REC}$ is the input voltage of the at least one rectifier, and $R_{REC}$ is an input resistance of the at least one rectifier, and with an input impedance of the at least one matching network equal to an impedance of the antenna.

7. The method of claim 6, wherein the input resistance of the at least one rectifier is given by:

$$R_{REC} = \frac{V_{REC}}{2NI_{SEQ}\left\{\left[\frac{I_L}{I_{SEQ}} - 2I_0\left(\frac{2V_{REC}}{n\phi_t}\right)\right]\frac{I_1\left(\frac{(2-n)V_{REC}}{n\phi_t}\right)}{I_0\left(\frac{(2-n)V_{REC}}{n\phi_t}\right)} + 2I_1\left(\frac{2V_{REC}}{n\phi_t}\right)\right\}}$$

where $I_{SEQ}$ is the transistor drain current, $I_L$ is an output current of the RFEH, n is a slope factor of transistors of the at least one rectifier, $\phi_t$ is a thermal voltage of the transistors, $I_0(z)$ is a modified Bessel function of first kind of order zero, and $I_1(z)$ is the modified Bessel function of first kind of order one.

8. The method of claim 7, wherein the output voltage of the at least one rectifier is determined as follows:

$$V_{OUT} = 2N\phi_t \ln \frac{I_0\left(\frac{2V_{REC}}{n\phi_t}\right) - \frac{I_L}{2I_{SEQ}}}{I_0\left(\frac{(2-n)V_{REC}}{n\phi_t}\right)}$$

where $V_{OUT}$ is the output voltage of the at least one rectifier and N is the number of stages.

9. An optimization system for a radio frequency energy harvester (RFEH), the RFEH comprising an antenna configured to receive power from a radio frequency (RF) energy source, at least one multi-stage rectifier configured to convert the power received at the antenna to a direct current (DC) output voltage, and at least one matching network performing impedance matching between the antenna and an input of the at least one rectifier, the system comprising:

at least one processing unit; and at least one non-transitory computer-readable memory having stored thereon program instructions executable by the processing unit for:

(a) receiving a target value for the power received at the antenna;

(b) selecting an initial value of a number of stages for the at least one rectifier from a first range of values, and selecting an initial value of a transistor drain current for the at least one rectifier from a second range of values;

(c) determining, based on the initial value of the number of stages and the initial value of the transistor drain current, a computed value of the power received at the antenna;

(d) determining an input voltage of the at least one rectifier at which the computed value of the power received at the antenna matches the target value;

(e) determining the output voltage of the at least one rectifier based on the input voltage, the initial value of the number of stages, and the initial value of the transistor drain current;

(f) when at least one additional value from at least one of the first range of values and the second range of values remains to be selected, incrementing at least one of the initial value of the number of stages and the initial value of the transistor drain current, and repeating steps (c) to (e);

(g) when all values from the first range of values and the second range of values are selected, determining a final value of the number of stages and a final value of the transistor drain current at which the output voltage of the at least one rectifier is highest; and (h) outputting the final value of the number of stages and the final value of the transistor drain current.

10. The system of claim 9, wherein the program instructions are executable by the processing unit for outputting, for all values from the first range of values and the second range of values, a plot of the output voltage of the at least one rectifier as a function of the number of stages and the transistor drain current.

11. The system of claim 10, wherein the program instructions are executable by the processing unit for selecting the final value of the number of stages and the final value of the transistor drain current at which the output voltage of the at least one rectifier is highest from the plot.

12. The system of claim 11, wherein the program instructions are executable by the processing unit for causing an actual RFEH comprising an actual rectifier having the final value of the number of stages and the final value of the transistor drain current to be manufactured.

13. The system of claim 12, wherein the program instructions are executable by the processing unit for causing the actual RFEH to be implemented on an integrated circuit using a Complementary Metal-Oxide-Semiconductor (CMOS) fabrication process.

14. The system of claim 9, wherein the program instructions are executable by the processing unit for determining the computed value of the power received at the antenna as follows:

$$P_{AV} = \frac{V_{REC}^2}{R_{REC}}$$

where $P_{AV}$ is the computed value of the power received at the antenna, $V_{REC}$ is the input voltage of the at least one rectifier, and $R_{REC}$ is an input resistance of the at least one rectifier, and with an input impedance of the at least one matching network equal to an impedance of the antenna.

15. The system of claim 14, wherein the input resistance of the at least one rectifier is given by:

$$R_{REC} = \frac{V_{REC}}{2NI_{SEQ}\left\{\left[\frac{I_L}{I_{SEQ}} - 2I_0\left(\frac{2V_{REC}}{n\phi_t}\right)\right]\frac{I_1\left(\frac{(2-n)V_{REC}}{n\phi_t}\right)}{I_0\left(\frac{(2-n)V_{REC}}{n\phi_t}\right)} + 2I_1\left(\frac{2V_{REC}}{n\phi_t}\right)\right\}}$$

where $I_{SEQ}$ is the transistor drain current, $I_L$ is an output current of the RFEH, n is a slope factor of transistors of the at least one rectifier, $\phi_t$ is a thermal voltage of the transistors, $I_0(z)$ is a modified Bessel function of first kind of order zero, and $I_1(z)$ is the modified Bessel function of first kind of order one.

16. The system of claim 15, wherein the program instructions are executable by the processing unit for determining the output voltage of the at least one rectifier as follows:

$$V_{OUT} = 2N\phi_t \ln \frac{I_0\left(\frac{2V_{REC}}{n\phi_t}\right) - \frac{I_L}{2I_{SEQ}}}{I_0\left(\frac{(2-n)V_{REC}}{n\phi_t}\right)}$$

where $V_{OUT}$ is the output voltage of the at least one rectifier and N is the number of stages.

17. A radio frequency energy harvester (RFEH) comprising:
an antenna configured to receive power from a radio frequency (RF) energy source;
a plurality of combined multi-stage cross-coupled rectifiers, each rectifier configured to convert the power received at the antenna to a direct current (DC) output voltage;
at least one matching network configured to perform impedance matching between the antenna and an input of each rectifier;
at least one processing unit; and
at least one non-transitory computer-readable memory having stored thereon program instructions executable by the processing unit for, for each rectifier:
(a) receiving a target value for the power received at the antenna;
(b) selecting an initial value of a number of stages for the rectifier from a first range of values, and selecting an initial value of a transistor drain current for the rectifier from a second range of values;
(c) determining, based on the initial value of the number of stages and the initial value of the transistor drain current, a computed value of the power received at the antenna;
(d) determining an input voltage of the rectifier at which the computed value of the power received at the antenna matches the target value;
(e) determining the output voltage of the rectifier based on the input voltage, the initial value of the number of stages, and the initial value of the transistor drain current;
(f) when at least one additional value from at least one of the first range of values and the second range of values remains to be selected, incrementing at least one of the initial value of the number of stages and the initial value of the transistor drain current, and repeating steps (c) to (e);
(g) when all values from the first range of values and the second range of values are selected, determining a final value of the number of stages and a final value of the transistor drain current at which the output voltage of the rectifier is highest; and
(h) outputting the final value of the number of stages and the final value of the transistor drain current.

18. The RFEH of claim 17, wherein the plurality of rectifiers are serially combined, whereby an output of each rectifier is fed as an input to a subsequent rectifier of the plurality of rectifiers and a DC output power of a last one of the plurality of rectifiers is provided to a load.

19. The RFEH of claim 17, wherein the plurality of rectifiers are combined through a summation block, whereby an output of each rectifier is fed as an input to the summation block, the summation block configured to combine DC output powers of the plurality of rectifiers into a DC output provided to a load.

20. The RFEH of claim 19, further comprising a plurality of filters configured to remove at least one component from an output provided by the antenna, wherein the at least one matching network comprises a plurality of matching networks, an input of each filter of the plurality of filters connected to the antenna, an output of each filter of the plurality of filters connected to an input of a corresponding one of the plurality of matching networks, and an output of each of the plurality of matching networks connected to the input of a corresponding one of the plurality of rectifiers.

* * * * *